(12) United States Patent
Matsunaga (10) Patent No.: US 7,902,844 B2
(45) Date of Patent: Mar. 8, 2011

(54) VOLTAGE DROP MEASUREMENT CIRCUIT

(75) Inventor: Toshiyuki Matsunaga, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 633 days.

(21) Appl. No.: 11/759,375

(22) Filed: Jun. 7, 2007

(65) Prior Publication Data
US 2007/0296421 A1 Dec. 27, 2007

(30) Foreign Application Priority Data

Jun. 7, 2006 (JP) .................................. 2006-158071

(51) Int. Cl.
*G01R 27/08* (2006.01)
(52) U.S. Cl. ...................................................... 324/713
(58) Field of Classification Search .......... 323/282–285, 323/299; 324/713, 712; 326/16; 327/185
See application file for complete search history.

(56) References Cited

U.S. PATENT DOCUMENTS

| | | | | |
|---|---|---|---|---|
| 4,071,822 A * | 1/1978 | Kamiya | ......................... | 324/111 |
| 4,193,026 A * | 3/1980 | Finger et al. | .................. | 324/428 |
| 4,377,781 A * | 3/1983 | Tatsushi et al. | ............... | 323/299 |
| 4,683,419 A * | 7/1987 | Neuelmann et al. | .......... | 324/718 |
| 6,060,862 A * | 5/2000 | Sase et al. | ..................... | 320/132 |
| 6,091,325 A * | 7/2000 | Zur et al. | ...................... | 340/455 |
| 6,185,458 B1* | 2/2001 | Ochs et al. | ........................ | 607/5 |
| 6,590,396 B1* | 7/2003 | Zur et al. | ...................... | 324/433 |
| 7,109,692 B1* | 9/2006 | Wu et al. | ....................... | 323/282 |
| 7,170,272 B2* | 1/2007 | Yoshida | ........................ | 323/284 |
| 7,298,122 B2* | 11/2007 | Bernacchia et al. | .......... | 323/282 |
| 2006/0259098 A1* | 11/2006 | Erickson | ......................... | 607/61 |
| 2007/0296421 A1* | 12/2007 | Matsunaga | ..................... | 324/713 |

FOREIGN PATENT DOCUMENTS

JP 2004-146612 5/2004

* cited by examiner

*Primary Examiner* — Adolf Berhane
*Assistant Examiner* — Yemane Mehari
(74) *Attorney, Agent, or Firm* — Young & Thompson (57) ABSTRACT

A voltage drop measurement circuit includes a voltage drop circuit to generate an output voltage and fluctuate the output voltage according to a fluctuation in a power supply voltage, where the output voltage being the power supply voltage dropped by a predetermined amount and a flip-flop to retain a flag indicating a drop in the power supply voltage according to the output voltage.

15 Claims, 8 Drawing Sheets

| AMOUNT OF VOLTAGE DROP B[V] | | 0 | 0.1 | 0.2 | 0.3 | 0.4 |
|---|---|---|---|---|---|---|
| HIGH LEVEL OUTPUT VOLTAGE VOUT[V] OF VOLTAGE DROP CONTROL CIRCUIT WITH NO VOLTAGE DROP | 0.6 | × | × | × | × | ○ |
| | 0.55 | × | × | × | ○ | ○ |
| | 0.5 | × | × | ○ | ○ | ○ |
| | 0.45 | × | ○ | ○ | ○ | ○ |

×= N/A
○= OK

Condition: THRESHOLD VOLTAGE OF INPUT TO FF2=0.4V
VDD=1.0V

RELATED ART

Fig. 9

VOLTAGE DROP MEASUREMENT CIRCUIT

BACKGROUND OF THE INVENTION

1. Field of the Invention

The present invention relates to a voltage drop amount measurement circuit, and particularly to a voltage drop amount measurement circuit for measuring that the amount of drop in a power supply voltage exceeds a predetermined value.

2. Description of Related Art

In recent years, a power supply voltage of a semiconductor device is coming to decrease. In a semiconductor device, a power supply voltage drops according to the amount of current consumed in an operation. The semiconductor device having a low power supply voltage has less margin for the power supply voltage of a circuit. In such semiconductor device, there is a problem that a drop of the power supply voltage could cause the circuit operation to be unstable.

Figure 9:
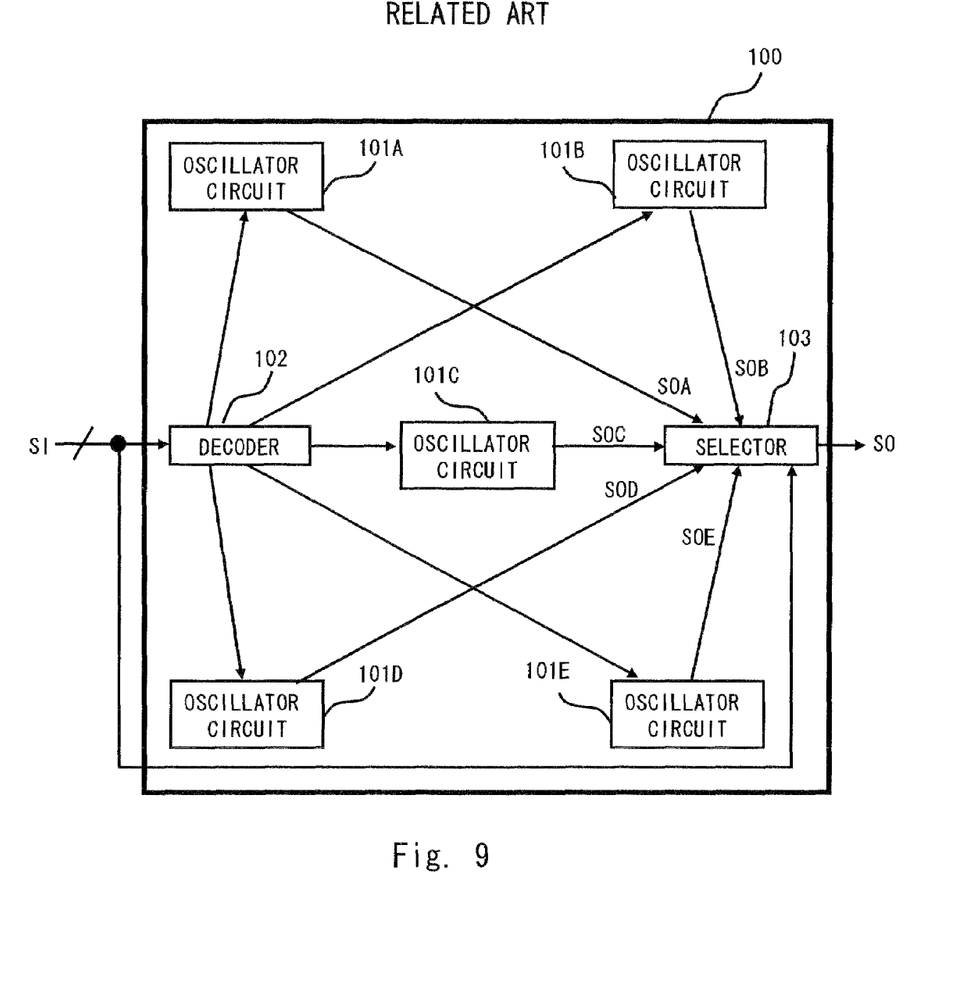
FIG. 9 is a schematic diagram showing a conventional voltage drop measurement circuit.

Thus the amount of drop of the operating power supply voltage in the semiconductor device has been measured. An example of a technique concerning the measurement of the drop amount of power supply voltage is disclosed in Japanese Unexamined Patent Application Publication No. 2004-146612. A voltage drop amount measurement circuit 100 disclosed in Japanese Unexamined Patent Application Publication No. 2004-146612 is shown in FIG. 9. As shown in FIG. 9, the voltage drop amount measurement circuit 100 includes oscillator circuits 101A to 101E, a decoder 102 and selector 103.

The oscillator circuits 101A to 101E are a ring oscillator that changes an oscillating frequency according to a power supply voltage. The decoder 102 outputs an operation instruction to one of the oscillator circuits 101A to 101E. The selector 103 selects the oscillator circuits operating according to the operation instruction from the decoder 102 and outputs an output from the selected oscillator circuit as an output signal SO. Here, the relationship between the oscillating frequency and the amount of drop in the power supply voltage is recorded on a table or the like and by comparing the oscillation frequency of the output signal SO using this table, the amount of drop of the power supply voltage around the operating oscillator circuit can be measured.

The oscillator circuits 101A to 101E of the output signal SO are placed at different positions of the semiconductor device. Therefore, by changing the oscillator circuit to operate, spread of the amount of drop in the power supply voltage for the semiconductor device can be found out.

However in this technique, the amount of power supply voltage drop is measured using an oscillating frequency of a ring oscillator. As the ring oscillator is made up of a plurality of inverters connected to form a circle, the circuit size becomes comparatively large. Thus by placing many oscillator circuits in a semiconductor device as with the voltage drop amount measurement circuit 100, there is a problem that the chip size increases.

Further, the ring oscillator requires predetermined time until the oscillating frequency is stabled. Accordingly it has been difficult to measure fluctuations in power supply voltage that are generated in a period of about 1 cycle of a clock. As the semiconductor device generally operates according to a clock, a voltage drop even in 1 cycle of a clock could be a problem. However, in the voltage drop measurement circuit of this technique, it is difficult to measure a drop in the power supply voltage in such a short period.

SUMMARY

In one embodiment of the present invention, there is provided a voltage drop measurement circuit that includes a voltage drop circuit to generate an output voltage and fluctuate the output voltage according to a fluctuation in a power supply voltage, the output voltage being the power supply voltage dropped by a predetermined amount and a flip-flop to retain a flag indicating a drop in the power supply voltage according to the output voltage.

In one embodiment of the present invention, the flip-flop is able to measure the amount of drop in the power supply voltage according to the output voltage of the voltage drop circuit. Specifically, by the flip-flop synchronizing to a clock signal and retaining the flag indicating the amount of voltage drop, a voltage drop generated in a period of 1 cycle of the clock signal can be measured. Further, as a voltage drop generated in 1 cycle period can be measured, by increasing the frequency of the clock signal that operates the flip-flop, the amount of drop in the power supply voltage can be measured more accurately.

In another embodiment of the present invention, there is provided a semiconductor device comprising a plurality of voltage drop measurement circuits, wherein the voltage drop circuit includes a voltage drop circuit to generate an output voltage and fluctuate the output voltage according to a fluctuation in a power supply voltage, the output voltage being the power supply voltage dropped by a predetermined amount and a flip-flop to retain a flag indicating a drop in the power supply voltage according to the output voltage.

According to the semiconductor device of the embodiments, it is possible to measure a local voltage drop according to the output voltage from the voltage drop measurement circuit of the semiconductor device.

According to the voltage drop measurement circuit of embodiments, it is possible to measure the amount of drop in the power supply voltage for each cycle of a clock signal.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
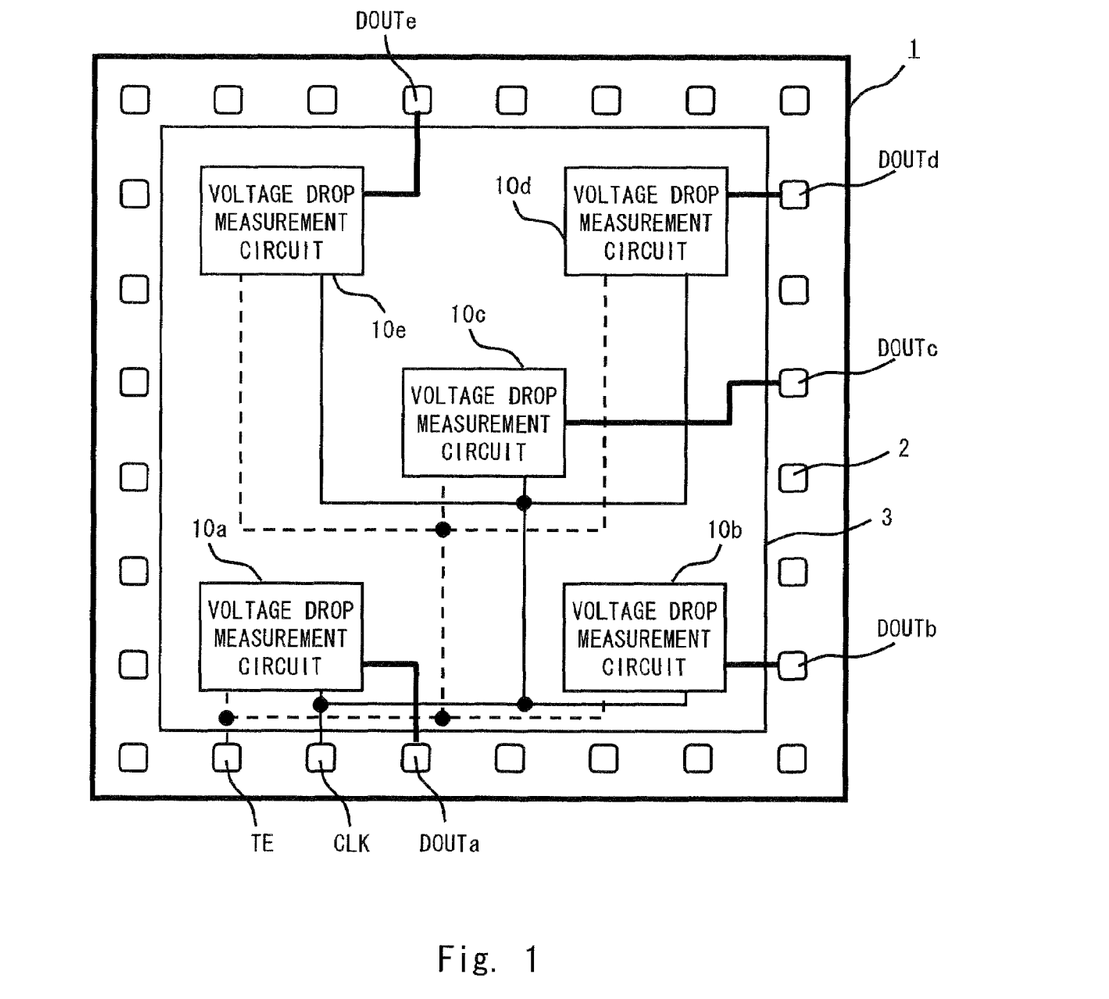
FIG. 1 is a schematic diagram showing a semiconductor device according to a first embodiment of the present invention.

FIG. 1 is a schematic diagram showing a semiconductor device 1 according to a first embodiment. As shown in FIG. 1, the semiconductor device 1 includes pads 2 along the outer periphery and a device region 3 placed inside. The pads 2 are input/output terminals for the semiconductor device 1. The device region 3 is a region where functional circuits of the semiconductor device 1 are formed. The semiconductor device 1 of this embodiment includes a plurality of voltage drop measurement circuits (for example voltage drop measurement circuit 10a to 10e) in the device region 3.

The voltage drop measurement circuits 10a to 10e operates according to a test enable signal TE and a clock signal CLK and outputs a measurement result of a drop of the power supply voltage. The voltage drop measurement circuits 10a, 10b, 10d and 10e are distributed near periphery of the device region 3 and the voltage drop measurement circuit 10c is placed near the center of the device region 3. Among the pads 2, each of the voltage drop measurement circuit 10a to 10e is connected to the pad supplying the test enable signal TE and the pad supplying the clock signal CLK. Further, each of the outputs from the voltage drop measurement circuits 10a to 10e is connected to corresponding pad among the pads 2 (for example pads DOUTa to DOUTe).

Figure 2:
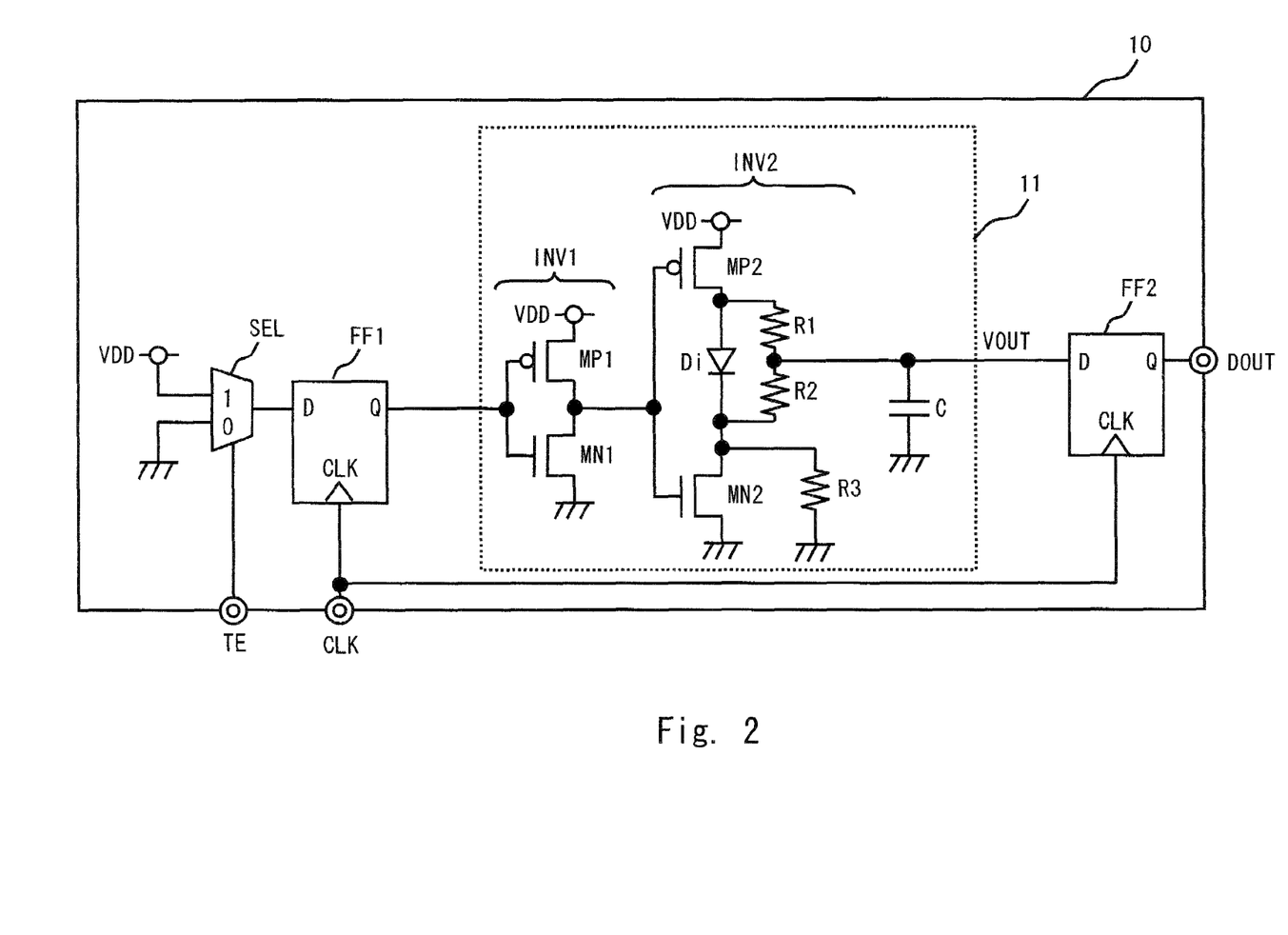
FIG. 2 is a circuit diagram showing a voltage drop measurement circuit according to the first embodiment of the present invention.

Hereinafter, the voltage drop measurement circuits 10a to 10e are described in detail. As the voltage drop measurement circuits 10a to 10e are same circuits, in the description that follows, they are collectively referred to as a voltage drop measurement circuit 10. The circuit diagram of the voltage drop measurement circuit 10 is shown in FIG. 2. As shown in FIG. 2, the voltage drop measurement circuit 10 includes a selector SEL, flip-flops FF1 and FF2 and a voltage drop circuit 11.

The selector SEL selects and outputs either one of two inputs according to the test enable signal TE. In this embodiment, the selector SEL includes input terminals "1" and "0". The input terminal "1" is connected to a power supply voltage VDD and the input terminal "0" is connected to a ground potential GND. When the test enable signal TE is in test status (for example when signal level is "1"), the selector SEL outputs the power supply voltage VDD. When the test enable signal TE is in normal operation status (for example when signal level is "0"), the ground potential GND is output.

The flip-flop FF1 is for example a D-type flip-flop. The D type flip-flop includes an input terminal D, output terminal Q and a clock input terminal. In response to a rising edge of the clock signal CLK, the D type flip-flop retains a logical level of a signal that is input to the input terminal D at that point and outputs the retained logical level of the signal. Herein, the logical high level corresponds the state where a signal level is exceeding a predetermined threshold. Further, the logical high level corresponds the state where a signal level is lower than the predetermined threshold. In this embodiment, the predetermined threshold is 40% voltage of the power supply voltage VDD. In the description that follows, this level is to be the threshold for an input signal of the flip-flops FF1 and FF2.

The voltage drop circuit 11 outputs the ground potential GND in response to an input of the ground potential GND, while in response to an input of the power supply voltage VDD, the output voltage VOUT with a drop for the predetermined amount in the power supply voltage VDD is output. When the power supply voltage VDD fluctuates, the output voltage is also fluctuated according to the amount of fluctuation. Details of the voltage drop circuit 11 are described later in detail.

The connection of the voltage drop measurement circuit 10 is described hereinafter in detail. Firstly an output from the selector SEL is connected to the input terminal D of the flip-flop FF1. The output terminal Q of the flip-flop FF1 is connected to an input of the voltage drop circuit 11. An output from the voltage drop circuit 11 is connected to the input terminal D of the flip-flop FF2. The output terminal Q of the flip-flop FF2 is connected to an output terminal DOUT of the voltage drop circuit 10. Incidentally, the clock signal CLK is input from outside to the clock input terminals of the flip-flops FF1 and FF2.

The voltage drop circuit 11 is described hereinafter in detail. The voltage drop circuit 11 includes inverters INV1 and INV2. The inverter INV1 includes a PMOS transistor MP1 and NMOS transistor MN1. The PMOS transistor MP1 and NMOS transistor MN1 are connected in series between the power supply voltage VDD and ground potential GND. A source of the PMOS transistor MP1 is connected to the power supply voltage VDD and a drain is connected to a drain of the NMOS transistor MN1. A source of the NMOS transistor MN1 is connected to the ground potential GND. A gate of the PMOS transistor MP1 and a gate of the NMOS transistor MN1 are connected to each other, and this gate is the input to the voltage drop circuit 11. Further, a node between the drain of the PMOS transistor MP1 and the drain of the NMOS transistor MN1 is an output from the inverter INV1.

The inverter INV 2 includes a PMOS transistor MP2, NMOS transistor MN2, diode D1, resistances R1 to R3 and capacitor C. The PMOS transistor MP2 and NMOS transistor MN2 are connected between the power supply voltage VDD and ground potential GND via a diode D1. A source of the PMOS transistor MP is connected to the power supply voltage VDD and a drain is connected to an anode of the diode D1. A cathode of the diode D1 is connected to a drain of the NMOS transistor MN2. A source of the NMOS transistor MN2 is connected to the ground potential GND. A gate of the PMOS transistor MP2 and a gate of the NMOS transistor MN2 are connected to each other, and this gate is connected to the output from the inverter INV1.

One end of the resistance 1 is connected to the anode of the diode Di and another end is connected to one end of the resistance R2. Another end of the resistance R2 is connected to the cathode of the diode Di. A node between the resistances R1 and R2 is an output terminal of the voltage drop circuit 11. Further, the capacitor C is connected between the node between the resistances R1 and R2 and the ground potential GND. One end of the resistance R3 is connected to the drain of the NMOS transistor MN2 and another end is connected to the ground potential GND.

Furthermore, the diode Di generates a diode voltage VF (for example 0.7V) between the cathode and anode when a current flows from the anode to the cathode (forward direction). The resistances R1 and R2 are resistances that have ratio of R1:R2=11:3, for example. Moreover, the resistance R3 specifies the amount of current flowing the diode D1 when the PMOS transistor MP2 is conductive. The capacitor C suppresses the sensitivity of voltage fluctuation in the output voltage VOUT from the voltage drop circuit 11.

The output voltage from the voltage drop circuit 11 is described hereinafter in detail. Firstly a case is described in which the voltage input to the voltage drop circuit 11 is low level (for example ground potential GND). At this time, the output from the inverter INV1 is high level (for example power supply voltage VDD). Depending on the output from the inverter INV1, an output from the inverter INV2 becomes low level. This causes the output voltage VOUT from the voltage drop circuit 11 to be low level.

Next, a case is described in which the voltage input to the voltage drop circuit is high level. At this time, the output from the inverter INV1 becomes low level. Depending on the output from the inverter INV1, the inverter INV2 becomes high level. Voltage of the high level for the inverter INV2 is a voltage dropped by a predetermined amount from the power supply voltage VDD.

The predetermined amount is described hereinafter. When the input to the inverter INV2 becomes low level, the PMOS transistor MP2 becomes conductive and the NMOS transistor MN2 becomes nonconductive. Then the voltage on the side of the anode of the diode D1 becomes the power supply voltage VDD. Further, a current flows from the diode D1 via the resistance R3. A diode voltage VF is generated at both ends of the diode Di. The output voltage VOUT from the voltage drop circuit 11 is output from the node between the resistances R1 and R2 that is connected in parallel to the diode Di. That is, the value of the output voltage VOUT is a value calculated by subtracting a divided value of the diode voltage VF by a resistance ratio of the resistances R1 and R2 from the power supply voltage VDD. For example it is VOUT=VDD−(VF·R1/(R1+R2)). In the first embodiment, the predetermined amount is a voltage represented by (VF·R1/(R1+R2)), which is previously specified by the diode voltage and resistances R1 and R2 and is almost constant regardless of the power supply voltage. Further, by the fluctuation of the power supply voltage VDD, the output voltage VOUT of the first embodiment follows the fluctuation of the power supply voltage VDD while maintaining the potential difference with the power supply voltage VDD to the predetermined amount.

Figure 3:
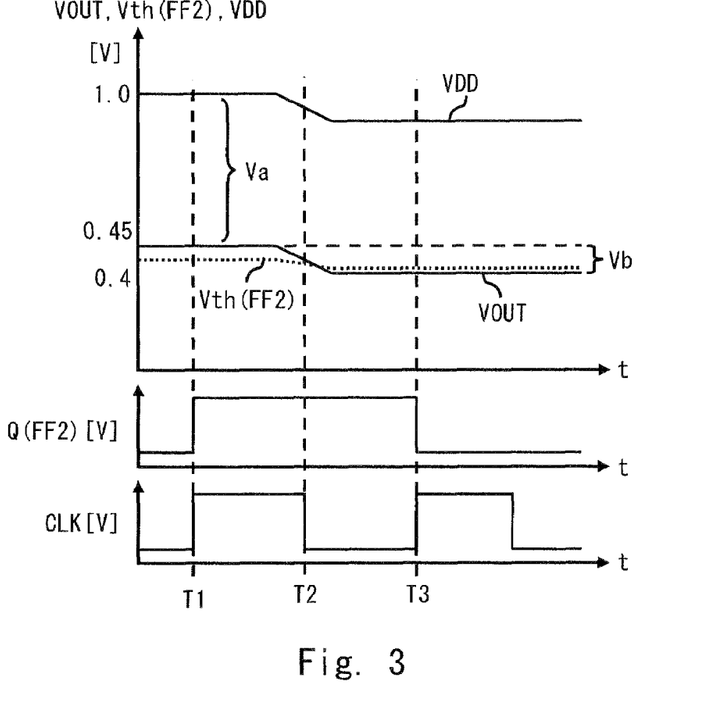
FIG. 3 is a timing chart showing an operation of the voltage drop measurement circuit according to the first embodiment of the present invention.

An operation of the voltage drop measurement circuit 10 is described hereinafter in detail. FIG. 3 is a timing chart showing the operation of the voltage drop measurement circuit 10. Note that FIG. 3 is a case when the test enable signal TE is in test status. Accordingly the selector SEL, flip-flop FF1 and voltage drop circuit 11 output high level. When the test enable signal TE is in normal operation status, the selector SEL outputs low level. Thus the outputs from flip-flop FF1, voltage drop circuit 11 and flip-flop FF2 are low level and do not fluctuate. Further, FIG. 3 is a case in which the power supply voltage VDD is 1.0V and an input threshold voltage Vth (FF2) of the flip-flop FF2 is 40% of the power supply voltage VDD.

The operation of the voltage drop measurement circuit 10 is described hereinafter in detail with reference to FIG. 3. As shown in FIG. 3, at timing T1, the power supply VDD does not fluctuate. Thus the output voltage VOUT from the voltage drop circuit 11 is 0.45V. The output voltage VOUT from the voltage drop circuit 11 is higher than the input threshold voltage Vth (0.40V) of the flip-flop FF2. At this time, if a rising edge of the clock signal CLK is input, the flip-flop 2 recognizes the input signal as high level. Thus a flag indicating that the voltage drop is not exceeding the predetermined value is retained and a high level is output.

At timing T2, a voltage drop of 0.1V is generated in the power supply voltage VDD. Thus at timing T3 when a next rising edge of the clock signal CLK is input, the output voltage VOUT from the voltage drop circuit 11 drops to 0.35V. Further, the input threshold voltage Vth (FF2) of the flip-flop FF2 drops to 0.36V. Therefore, the value of the output voltage VOUT from the voltage drop circuit 11 becomes smaller than the input threshold voltage Vth (FF2) of the flip-flop FF2. Therefore at the timing T3, as the flip-flop FF2 recognizes the input voltage as low level, the flag indicating that a voltage drop is generated is retained and a low level is output.

Figure 4:
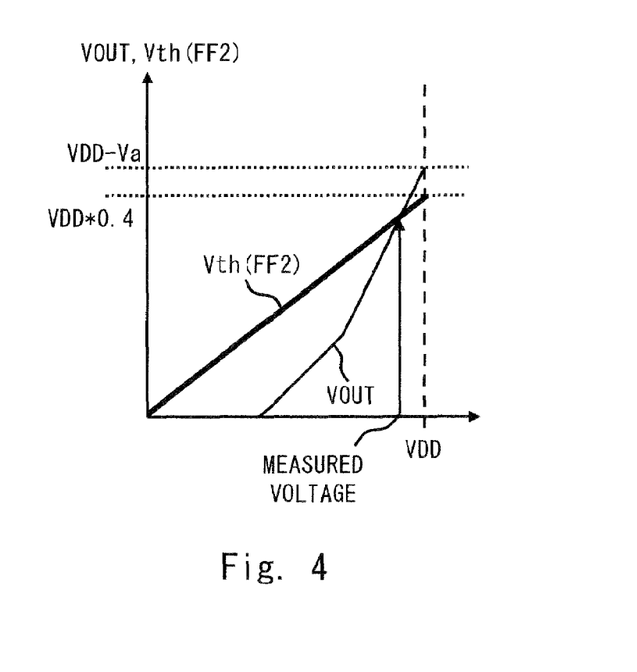
FIG. 4 is a graph showing power supply voltage dependency of an output voltage from a voltage drop circuit and an input threshold voltage of a flip-flop according to the first embodiment of the present invention.

Here, a relationship between the output voltage VOUT from the voltage drop circuit 11 and the input threshold voltage Vth (FF2) of the flip-flop FF2 is described hereinafter. FIG. 4 is a graph showing a voltage fluctuation in the output voltage VOUT and input threshold voltage Vth (FF2) for the fluctuation of the power supply voltage VDD. In FIG. 4, the horizontal axis indicates the voltage of the power supply voltage VDD and the vertical axis indicates the output voltage VOUT and input threshold voltage Vth (FF2).

As shown in FIG. 4, the input threshold voltage Vth (FF2) maintains 40% of the power supply voltage VDD and changes according to a drop in the power supply voltage VDD. Further, if the power supply voltage VDD is larger than the diode voltage VF, specifically larger than 0.7V, the output voltage VOUT fluctuates almost same amount as the fluctuation in the power supply voltage VDD. On the other hand, if the power supply voltage is not exceeding the diode voltage VF, specifically not exceeding 0.7V, the output voltage VOUT becomes the voltage divided by a resistance ratio calculated by the resistance R1 and a sum of the resistances R2 and R3 and fluctuates according to the fluctuation in the power supply voltage VDD.

Further, in the region where the power supply voltage VDD is high, the output voltage VOUT is higher than the input threshold voltage Vth (FF2). The voltage difference between the output voltage VOUT and input threshold voltage Vth (FF2) becomes smaller along with the decrease in the power supply voltage VDD. By a further decrease of the power supply voltage VDD, the voltage difference is inversed. By inversing the voltage difference and further decrease in the power supply voltage VDD, the voltage difference increases again. The point where the relationship between the output voltage VOUT and the input threshold voltage Vth (FF2) is a measured voltage. Specifically, when the measured voltage becomes lower than the power supply voltage VDD, the flip-flop FF2 outputs a low level.

As described in the foregoing, according to the voltage drop measurement circuit 10 of this embodiment, in case of a voltage drop in the power supply voltage exceeding the predetermined value, by inverting the relationship between the output voltage VOUT from the voltage drop circuit 11 and the input threshold voltage Vth (FF2) of the flip-flop FF2, the voltage drop in the power supply voltage VDD can be measured. Further, the measurement of the fluctuation in the power supply voltage VDD is carried out by a flip-flop at every rising edge of the clock signal CLK. This enables to measure the voltage fluctuation for each cycle of the clock signal.

Furthermore, when the power supply voltage VDD is higher than the diode voltage VF, the output voltage VOUT from the voltage drop circuit 11 of this embodiment is set to a voltage that is dropped by a predetermined amount from the power supply voltage. The predetermined amount is specified by the diode voltage VF and the resistance ratio of the resistances R1 and R2. That is, by changing the resistance ratio between the resistances R1 and R2, the value of the output voltage VOUT when there is no fluctuation in the power supply voltage VDD (for example an initial value of the output voltage VOUT) can be changed. Incidentally, if the power supply voltage VDD is not exceeding the diode voltage VF, the output voltage VOUT will have a value that is calculated by dividing the power supply voltage VDD by a resistance ratio between the resistance R1 and the sum of the resistances R2 and R3. Therefore in this case as well, the value of the output voltage VOUT changes by the values of the resistances R1 and R2. The measurable amount of drop in the power supply voltage VDD is determined by the relationship between the initial value of the output voltage and the value of the input threshold voltage Vth (FF2).

Figure 5:
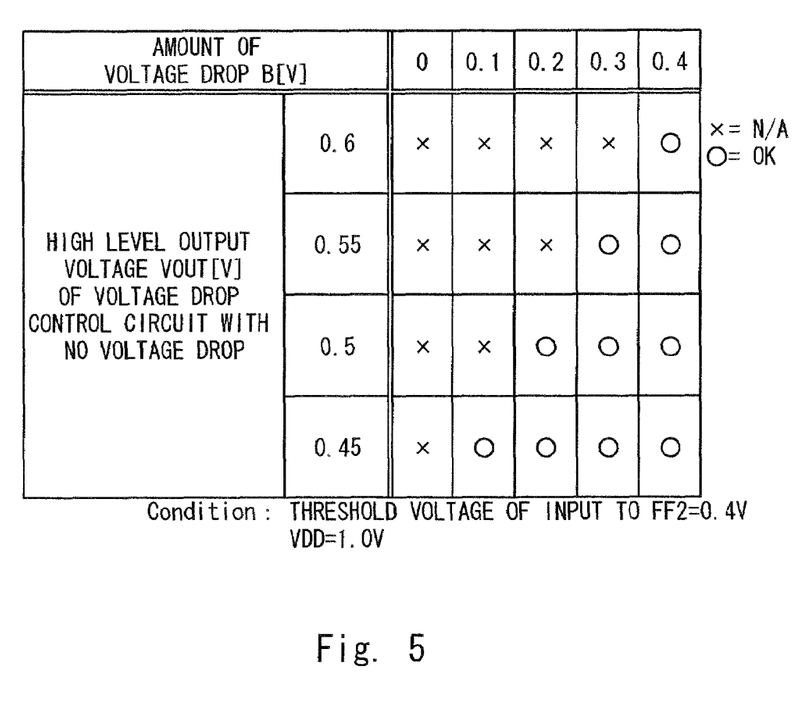
FIG. 5 is a table showing a relationship between an initial value of an output voltage from the voltage drop circuit and the measurable amount of drop in the power supply voltage.

Here, a relationship is described hereinafter between the initial value of the output voltage VOUT and the measurable amount of drop in the power supply voltage VDD when the power supply voltage VDD is 1V and the input threshold voltage Vth (FF2) of the flip-flop FF2 is 0.4V. On the other hand, if the initial value of the output voltage VOUT is 0.45V, the measurable amount of drop in the power supply voltage VDD is 0.1V. Specifically, by changing the setting of the initial value of the output voltage VOUT, it is possible to change the amount of drop in the power supply voltage VDD that can be measured by the voltage drop measurement circuit 10.

In the semiconductor device 1 of this embodiment, the voltage drop measurement circuit 10 is distributed and by referring to each of the measurement results, it is possible to recognize the spread of the voltage drop in the semiconductor device. By placing the voltage drop measurement circuit 10 having different settings in adjacent regions and referring to each of the measurement result for the voltage drop measurement circuit 10 having different settings, the amount of drop in the power supply voltage in the region can be validated in more detail.

The voltage drop measurement circuit 10 of this embodiment can be formed by combining circuits including flip-flop and inverter and a large-sized circuit such as a ring oscillator as in the conventional technique will not be used. Specifically, as the area occupied by the voltage drop measurement circuit 10 is extremely small, it is possible to suppress the chip area from increasing that is caused by placing the voltage drop measurement circuit 10.

Second Embodiment

Figure 6:
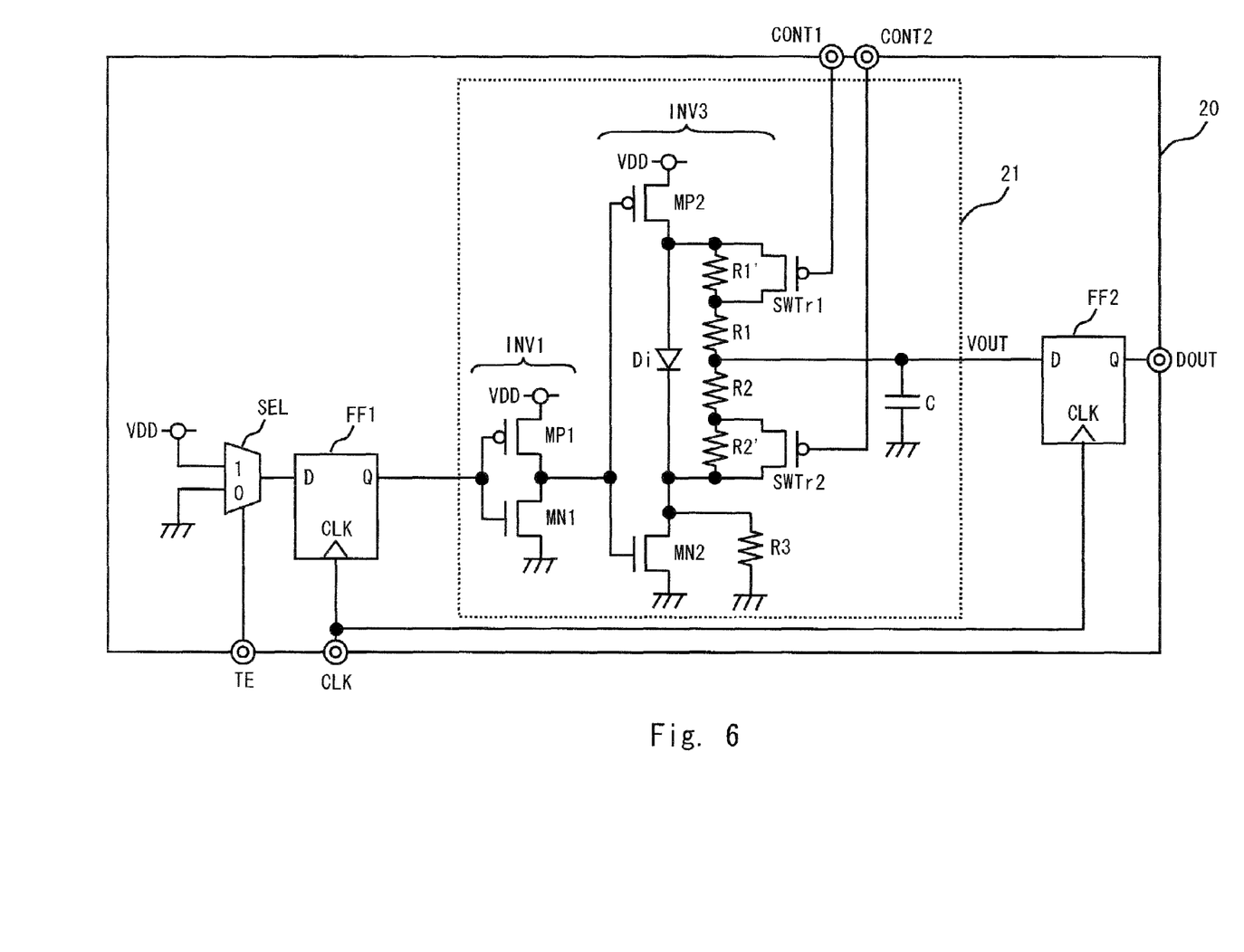
FIG. 6 is a circuit diagram showing a voltage drop measurement circuit according to a second embodiment of the present invention.

A semiconductor device of a second embodiment uses a voltage drop measurement circuit 20 in place of the voltage drop measurement circuit 10 of the first embodiment. The voltage drop measurement circuit 20 further includes a function to change the initial value of the output voltage VOUT from the voltage drop circuit 11 of the voltage drop measurement circuit 10 by a control signal input from outside.

The circuit diagram of the voltage drop measurement circuit 20 is shown in FIG. 6. In the description that follows, like parts in the voltage drop measurement circuits 10 and 20 are marked throughout the specification with the same reference numerals, with description omitted. The voltage drop measurement circuit 20 includes a voltage drop circuit 21 instead of the voltage drop circuit 11 of the voltage drop measurement circuit 10. The voltage drop circuit 21 includes inverters INV1 and INV3. The inverter INV1 is substantially the same as the inverter INV1 of the first embodiment.

The inverter INV3 includes resistances R1' and R2' and switch transistors SWTr1 and SWTr2 in addition to the inverter 2 of the first embodiment. The resistance R1' is connected in series with the resistance R1. The switch transistor SWTr1 is connected in parallel to the resistance R1'. The resistance R2' is connected in series with the resistance R2. The switch transistor SWTr2 is connected in parallel to the resistance R2'.

Conductive state of the switch transistors SWTr1 and SWTr2 is determined according to external input control signals CONT1 and CONT2. For example when the control signals CONT1 and CONT2 are high level, the switch transistors STTr1 and SWTr2 becomes nonconductive. On the other hand, when the control signals CONT1 and CONT2 are low level, the switch transistors STTr1 and SWTr2 become conductive.

When the switch transistor SWTr1 is conductive, the resistance R1' becomes invalid, while when the switch transistor SWTr1 is nonconductive, the resistance R1' becomes valid. If the resistance R1' is valid, a resistance value on the side where the resistance R1 is connected is to be a value the resistances R1 and R1' are added. On the other hand, when the switch transistor SWTr2 is conductive, the resistance R2' becomes invalid, while when the switch transistor SWTr2 is nonconductive, the resistance R2' becomes valid. If the resistance R2' is valid, a resistance value on the side where the resistance R2 is connected is to be a value the resistances R2 and R2' are added.

Specifically, the resistance ratio between the resistance R1 side and the resistance R2 side can be changed according to whether to enable the resistances R1' and R2' by the switch transistors SWTr1 and SWTr2. By changing the resistance ratio, the initial value of the output voltage VOUT from the voltage drop circuit 21 can be changed. Further by changing the initial value of the output voltage VOUT from the voltage drop circuit 21, the measurable amount of drop in the power supply voltage VDD can be changed.

As described in the foregoing, according to the voltage drop measurement circuit 20 of the second embodiment, the value of the power supply voltage VDD that can be measured by the voltage drop measurement circuit 20 can be changed after manufacturing the semiconductor device. Moreover, as the change can be made by the external input control signals CONT1 and CONT2, the detailed amount of drop in the power supply voltage VDD can be confirmed in a test that is carried out after manufacturing the semiconductor device.

Third Embodiment

Figure 7:
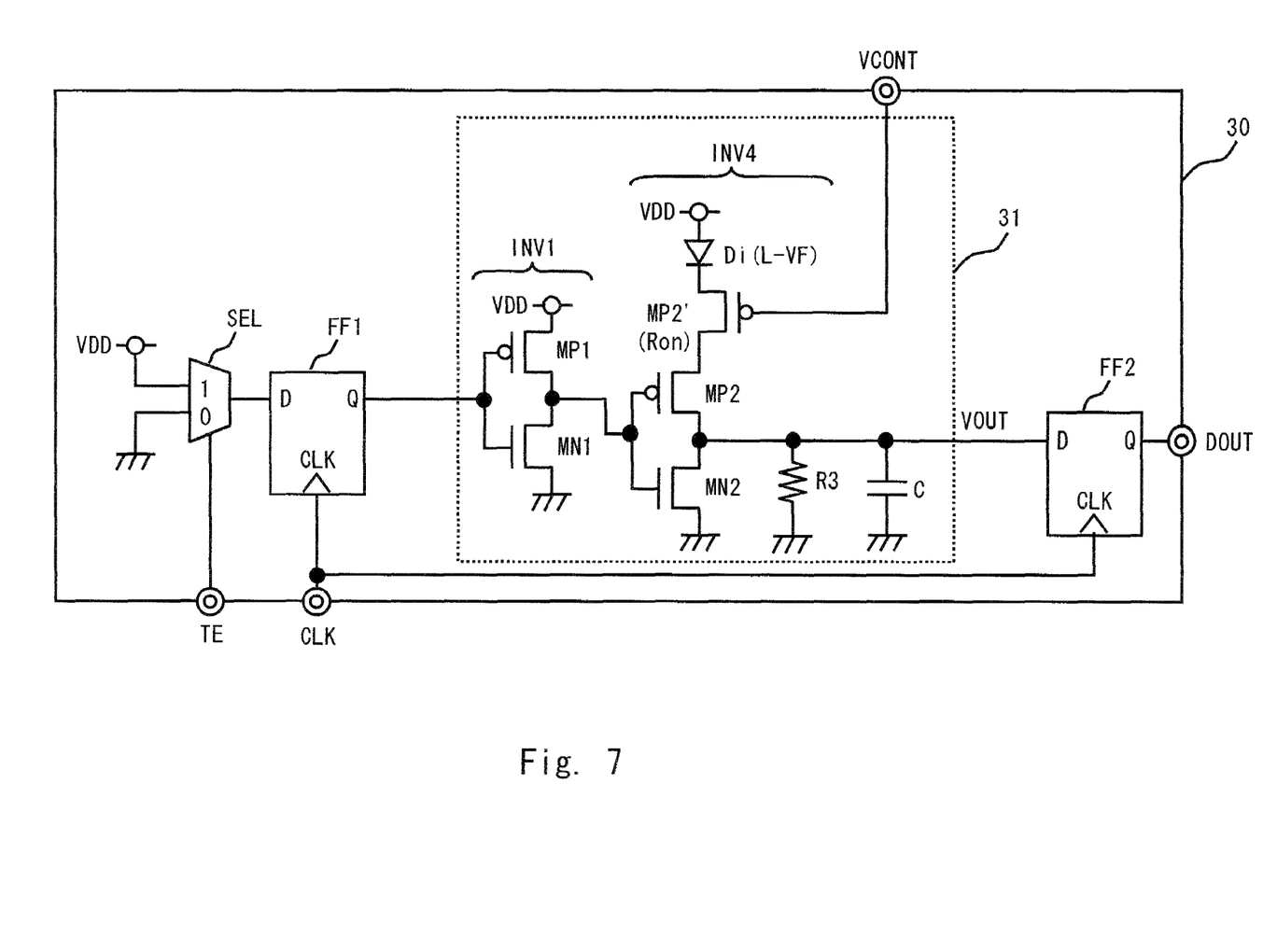
FIG. 7 is a circuit diagram showing a voltage drop measurement circuit according to a third embodiment of the present invention.

A semiconductor device of a third embodiment includes a voltage drop measurement circuit 30 instead of the voltage drop measurement circuit 10 of the first embodiment. The voltage drop measurement circuit 30 further includes a function to change the initial value of the output voltage VOUT from the voltage drop circuit 11 of the voltage drop measurement circuit 10 by a control signal input from outside.

The circuit diagram of the voltage drop measurement circuit 30 is shown in FIG. 7. In the description that follows, like parts in the voltage drop measurement circuits 10 and 30 are marked throughout the specification with the same reference numerals, with description omitted. The voltage drop measurement circuit 30 includes a voltage drop circuit 31 instead of the voltage drop circuit 11 of the voltage drop measurement circuit 10. The voltage drop circuit 31 includes inverters INV1 and INV4. The inverter INV1 is substantially the same as the inverter INV1 of the first embodiment.

The inverter INV4 includes PMOS transistors MP2 and MP2', NMOS transistors MP2, diode Di, resistance R3 and capacitor C. The PMOS transistors MP2 and MP2', NMOS transistor MN2 and diode Di are connected in series between the power supply voltage VDD and ground potential GND. Note that a diode voltage VF of the diode Di used in the third embodiment is smaller than the diode normally manufactured in a manufacturing process. For example, the diode voltage of this diode Di is approximately 0.2V.

An anode of the diode Di is connected to the power supply voltage VDD and a cathode is connected to a source of the PMOS transistor MP2'. A control voltage VCONT is input from outside to a gate of the PMOS transistor MP2'. A drain of the PMOS transistor MP2' is connected a source of the PMOS transistor MP2. A drain of the NMOS transistor MP2 is connected to a drain of the NMOS transistor MN2. A source of the NMOS transistor MN2 is connected to the ground potential. A gate of the PMOS transistor MP2 and a gate of the NMOS transistor MN2 are connected to each other, and this gate is connected to an output of the voltage drop circuit 1. Further, a node between the drain of the PMOS transistor MP2 and the drain of the NMOS transistor MN2 is an output terminal of the voltage drop circuit 31. Moreover, the resistance R3 and capacitor C are connected between the output terminal and ground potential GND.

In the inverter INV4, a resistance value Ron in the conductive state of the PMOS transistor MP2' fluctuates according to the voltage value of the control voltage VCONT. The inverter INV4 when inputting a high level, has a voltage dividing the power supply voltage VDD by a resistance ratio between the resistance value Ron and resistance R3 as an output voltage. Specifically, the output voltage VOUT from the voltage drop circuit 31 is specified according to a resistance ratio between the resistance value Ron of the PMOS transistor MP2' and the resistance R3. Further, even when the power supply voltage VDD fluctuates, the output voltage VOUT from the voltage drop circuit 31 outputs a value that is calculated by dividing the fluctuated power supply voltage VDD according to the resistance ratio between the resistance value Ron and resistance R3.

Figure 8:
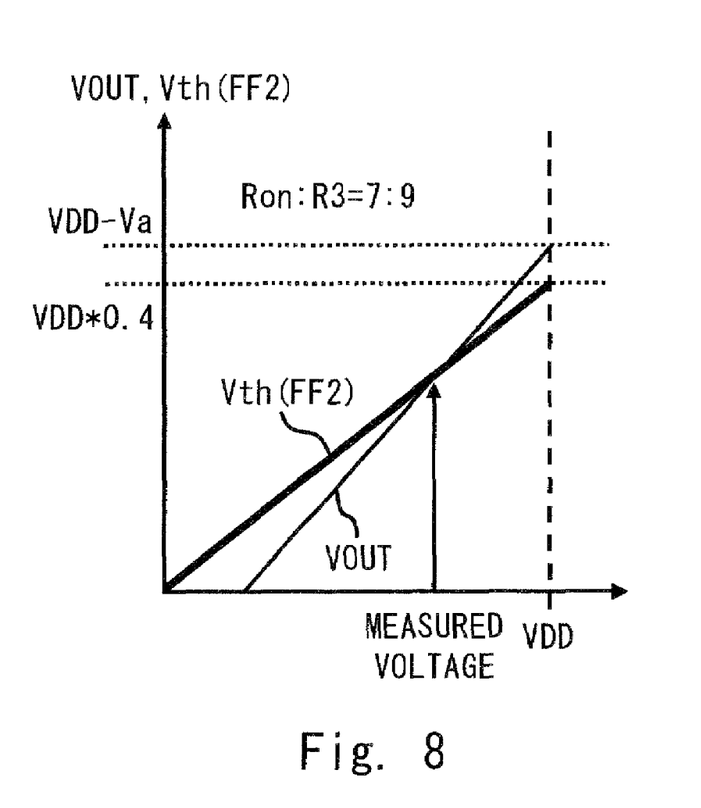
FIG. 8 is a graph showing power supply voltage dependency of an output voltage from a voltage drop circuit and an input threshold voltage of a flip-flop according to the third embodiment of the present invention.

An example is described here regarding the relationship between the output voltage VOUT from the voltage drop circuit 31 and the power supply voltage VDD. FIG. 8 is a view showing a relationship between the fluctuation in the output voltage VOUT from the voltage drop circuit 31 and the input threshold voltage Vth (FF2) f the flip-flop FF2 for the fluctuation in the power supply voltage. FIG. 8 is a view in case the ratio between the resistance value Ron and resistance R3 is Ron:R3=7:9. As shown in FIG. 8, even by the voltage drop circuit 31, along with the decrease in the power supply voltage VDD, the voltage difference between the output voltage VOUT from the voltage drop circuit 31 and the input threshold voltage Vth (FF2) of the flip-flop FF2 becomes smaller. Further decrease in the power supply voltage VDD causes to invert the relationship between the output voltage VOUT from the voltage drop circuit 31 and the input threshold voltage Vth (FF2) of the flip-flop FF2. Even further decrease in the power supply voltage VDD that is smaller than the power supply voltage VDD causing to invert the relationship between the output voltage VOUT from the voltage drop circuit 3 and the input threshold voltage Vth (FF2) of the flip-flop FF2 causes to increase again the voltage difference. In the third embodiment as well, the point where the output voltage VOUT from the voltage drop circuit 31 intersects the input threshold voltage Vth (FF2) of the flip-flop FF2 is the amount of drop in the power supply voltage VDD to be measured.

As described in the foregoing, according to the voltage drop measurement circuit 30 of the third embodiment, the initial value of the output voltage VOUT can be changed by the control voltage VCONT that is input from outside even after the semiconductor device is manufactured. This enables to change the measurable amount of drop in the power supply voltage VDD even after the semiconductor device is manufactured.

Furthermore, the resistance value Ron of the PMOS transistor MP2' changes according to the voltage value of the control voltage VCONT. According to this, by making the control voltage VCONT to an analog value, the resistance value RON can be continuously changed. Therefore the voltage drop measurement circuit 30 is able to continuously change the initial value of the output voltage VOUT and thus the amount of drop in the power supply voltage VDD can be measured in more detail than the first and second embodiments.

The present invention is not limited to the above embodiment and it may be modified and changed without departing from the scope and spirit of the invention. For example the initial value of the output voltage from the voltage drop circuit and the input threshold voltage of the flip-flop can be changed as appropriate. Further, a selector or the like may be placed in the semiconductor device to selectively output an output from the plurality of voltage drop measurement circuits.

It is apparent that the present invention is not limited to the above embodiments, but may be modified and changed without departing from the scope and spirit of the invention.

What is claimed is:

1. A voltage drop measurement circuit, comprising:
    a voltage drop circuit configured to generate an output voltage and fluctuate the output voltage according to a fluctuation of a power supply voltage, a voltage difference between the output voltage and the power supply voltage being maintained by a predetermined amount; and
    a flip-flop configured to retain a flag indicating a drop of the power supply voltage according to the output voltage.

2. The voltage drop measurement circuit according to claim 1, wherein the voltage drop circuit changes a value of the output voltage according to an external input signal.

3. The voltage drop measurement circuit according to claim 2, wherein the flip-flop includes an input voltage threshold to evaluate a level of an input signal and the input voltage threshold fluctuates according to the fluctuation in the power supply voltage.

4. The voltage drop measurement circuit according to claim 1, wherein the voltage drop circuit generates the output voltage, the output voltage being a voltage dividing the power supply voltage by a predetermined division ratio.

5. The voltage drop measurement circuit according to claim 4, wherein the voltage drop circuit changes the division ratio according to an external input signal.

6. The voltage drop measurement circuit according to claim 4, wherein the flip-flop includes an input voltage threshold to evaluate a level of an input signal and the input voltage threshold fluctuates according to the fluctuation in the power supply voltage.

7. The voltage drop measurement circuit according to claim 5, wherein the flip-flop includes an input voltage threshold to evaluate a level of an input signal and the input voltage threshold fluctuates according to the fluctuation in the power supply voltage.

8. The voltage drop measurement circuit according to claim 1, wherein the flip-flop includes an input voltage threshold to evaluate a level of an input signal and the input voltage threshold fluctuates according to the fluctuation in the power supply voltage.

9. A voltage drop measurement circuit, comprising:
    a voltage drop circuit to generate an output voltage and fluctuate the output voltage according to a fluctuation of a power supply voltage, the output voltage being the power supply voltage dropped by a predetermined amount; and a flip-flop to retain a flag indicating a drop of the power supply voltage according to the output voltage, wherein the flip-flop includes an input voltage threshold to evaluate a level of an input signal and the input voltage threshold fluctuates according to the fluctuation in the power supply voltage, and wherein the input voltage threshold and the output voltage fluctuate at different sensitivities for the fluctuation in the power supply voltage.

10. A semiconductor device comprising a plurality of voltage drop measurement circuits, wherein each of the plurality of voltage drop measurement circuits include the voltage drop measurement circuit of claim 1.

11. A voltage drop measurement circuit, comprising:

a voltage drop circuit which generates an output voltage that fluctuates based on a power supply voltage; and a detector which has a threshold voltage and which determines a drop of the power supply voltage by inversing a voltage difference between the output voltage and the threshold voltage, wherein the threshold voltage fluctuates based on the power supply voltage, the output voltage fluctuates more widely when the power supply voltage fluctuates than the threshold voltage.

12. The voltage drop measurement circuit according to claim 11, wherein the detector detects the drop of the power supply voltage for each cycle of a clock signal.

13. The voltage drop measurement circuit according to claim 11, wherein the voltage drop circuit includes a constant voltage circuit and at least two resistors, the constant voltage circuit is coupled to the power supply voltage, the resistors are coupled in parallel with the constant voltage circuit, and the output voltage is voltage of a joint of the resistors.

14. The voltage drop measurement circuit according to claim 13, wherein the resistors change the resistance value according to a control signal.

15. The voltage drop measurement circuit according to claim 11, wherein the voltage drop circuit includes a constant voltage circuit, a transistor and a resistor, the constant voltage circuit is coupled to the power supply voltage, the transistor is coupled between the constant voltage circuit and the resistor, and the output voltage is voltage of a joint of the transistor and the resistor.

* * * * *